United States Patent [19]

Tenjin

[11] 4,429,291
[45] Jan. 31, 1984

[54] ROTARY PRE-SETTING FINE TUNING DEVICE FOR A TURRET TYPE TELEVISION TUNER

[75] Inventor: Kaoru Tenjin, Ueno, Japan

[73] Assignee: NEC Kansai, Ltd., Otsu, Japan

[21] Appl. No.: 329,022

[22] Filed: Dec. 9, 1981

[30] Foreign Application Priority Data

Dec. 15, 1980 [JP] Japan .................... 55-180576[U]

[51] Int. Cl.³ .............................................. H03J 5/26
[52] U.S. Cl. .................................... 334/51; 74/10.85; 464/41
[58] Field of Search .................... 334/51; 74/10.85; 464/30, 41, 42, 89

[56] References Cited

U.S. PATENT DOCUMENTS

| | | |
|---|---|---|
| 3,183,726 | 5/1965 | Badger . |
| 3,861,815 | 1/1975 | Landaeus ..................... 464/89 X |
| 3,898,879 | 8/1975 | Cappelle et al. . |
| 4,041,422 | 8/1977 | Noji et al. . |
| 4,128,821 | 12/1978 | Kato et al. . |
| 4,152,682 | 5/1979 | Ito et al. . |
| 4,311,056 | 1/1982 | Tanida ........................ 334/51 X |

*Primary Examiner*—Paul L. Gensler
*Attorney, Agent, or Firm*—W. G. Fasse; D. H. Kane, Jr.

[57] ABSTRACT

The present television fine tuning is constructed so that an initial rotation establishes the fine tuning state and that a continued rotation of the fine tuning shaft performs the fine tuning. For this purpose the present tuner comprises a fine tuning driving member, a rotation transmitting idler member, a plate spring for supporting the idler member and a fine tuning adjustment element. The driving member includes a fine tuning shaft, a slide gear and a slip clutch concentrically mounted on the front of the chassis around a channel selector shaft supported by the chassis. The slip clutch has a plastic collar loosely mounted around the selector shaft, and a metallic sheet member located in a gap formed between the inner surface of the plastic collar and the outer surface of the selector shaft.

7 Claims, 6 Drawing Figures

ROTARY PRE-SETTING FINE TUNING DEVICE FOR A TURRET TYPE TELEVISION TUNER

BACKGROUND OF THE INVENTION

The present invention relates to a memory fine tuning arrangement used for television tuners, and more particularly to an improved and simplified fine tuning mechanism used for rotary pre-setting fine tuning devices.

Turret type television tuners generally include an incrementally rotatable channel selector shaft for selectively connecting certain elements of a plurality of tuned circuit elements for each of a plurality of channel selector positions. For example, one such turret tuner arrangement is disclosed in U.S. Pat. No. 4,128,821, wherein a rotatable turret having a plurality of tuning coil units, is rotatably mounted on a chassis base. For clear reception in each of the channel positions of the selector shaft in such tuners, it is customary to include an adjustable impedance device in the local oscillator circuit. This impedance device is conventionally adjusted by means of a fine tuning shaft concentrically mounted with respect to the channel selector shaft. The viewer or user can use the fine tuning shaft to adjust the tuning impedance for each predetermined position of the selector shaft. Various memory fine tuning arrangements have been proposed to maintain individual channel tuning adjustments once they have been established by the user or operator without requiring any further adjustment of the fine tuning shaft of the tuner by the user each time a particular channel is selected. One such arrangement is the push pre-setting type fine tuning device that requires the operator to push in a control knob of the fine tuning shaft while maintaining pressure on the knob to rotate the same to adjust a fine tuning element within the tuner. The other arrangement is a rotary pre-setting type fine tuning devide that requires the operator to only rotate a control knob of the fine tuning shaft for fine tuning adjustment. These devices are particularly useful on turret type television tuners having tuned coil assemblies or units for each channel. These coil units are removably mounted in the rotatable turret structure, and are individually provided with an oscillator coil, the inductance of which may be adjusted by means of an adjustable element which extends into an opening in the end of the coil units adjacent to the oscillator coil.

Because television tuners are made in large volumes and in order to be commercially competitive, it is desirable to provide a low cost pre-setting fine tuning device with a minimum number of parts which may be assembled in an easy and simple manner. The fine tuning device requires a mechanical arrangement to translate the rotary motion of the fine tuning shaft into the rotary motion of the adjustment element, since the fine tuning shaft is laterally offset from the axis of the adjustment element in the individual coil units. Further, engagement of the fine tuning shaft with the adjustment element must terminate automatically when the user releases the fine tuning shaft so that the turret is free to rotate to another channel position. For example, such fine tuning devices are disclosed in U.S. Pat. Nos. 3,316,770; 3,466,549; 4,041,422; 4,128,821; 4,152,682; and 4,253,074 for push pre-setting type memory fine tuners, and in U.S. Pat. Nos. 3,183,726 and 3,898,879 for rotary pre-setting type memory fine tuners.

U.S. patent application Ser. No. 97,847 filed on Nov. 27, 1979, now U.S. Pat. No. 4,311,056, discloses an improved rotary pre-setting fine tuning device including a fine tuning driving member mounted concentrically around the channel selector shaft supported between the front and rear walls of the chassis, a spring member located between the chassis and the fine tuning driving member, an idler member for transmitting fine tuning movement that is rotatably supported in the spring member, and a fine tuning adjustment element movably supported in each end of the respective coil units, wherein the fine tuning driving member comprises a plastic fine tuning shaft, a plastic slide gear, and a slip clutch mounted on the metallic channel selector shaft. The spring member, which biases the slide gear in the thrust direction, supports on its inclined flat surface an idler member for transmitting the fine tuning movement of the fine tuning shaft through the slide gear to a fine tuning adjustment element. The fine tuning shaft is mounted concentrically in the fine tuning driving member and rotatably around the channel selector shaft. The fine tuning driving member is connected with the slide gear by cam means. The slip clutch is mounted within a space between the channel selector shaft and the slide gear at a given position of the selector shaft.

The cam means for connecting the fine tuning shaft and the slide gear comprises a driving cam surface formed by the rear end of the fine tuning shaft and a driven cam surface formed by the front end of the slide gear. The slip clutch formed by a resilient collar of lubricant plastic material is inserted in the space formed by the inside surfaces of both the enlarged or greater diametrical portions of the fine tuning shaft and the slide gear and the outside surface of the channel selector shaft. To insure that a frictional force is applied to the slip clutch, a metal spring may be attached to the resilient collar. The inner surface of the collar is frictionally engaged against the outer surface of the channel selector shaft. Further, the fine tuning shaft and the slip clutch are operatively positioned on the channel selector shaft by using retaining means so that the fine tuning shaft may rotate freely when torque is applied to it while the slip clutch is frictionally rotated by means of the slide gear. The slip clutch is provided with recessed and raised portions on the outer surface of the resilient collar. The slide gear is provided with raised and recessed portions along the axial direction the inner surface of the greater diametrical portion thereof so that both the recessed and raised portions are protected against rotational relative displacement while the frictional rotation of the slide gear and of the slip clutch is permitted.

However, it has been found that undesired friction may be produced in the slip clutch of the fine tuning driving member mentioned above. That is, because the resilient collar of the slip clutch is formed of a plastic material, when the slip clutch is rotated at the time of fine tuning operation, a large quantity of frictional heat is generated by the frictional engagement of the plastic slip clutch against the channel selector shaft formed by a metallic material. The inner surface of the plastic slip clutch will be defaced from fatigue due to such frictional heat, and as a result, the obtainable rotational torque becomes unstable. In anticipation of such unstable rotational torque, a metallic spring with a somewhat larger resiliency may be attached to the slip clutch, but such an arrangement often causes an excessive frictional force caused by the slip clutch rubbing against the channel selector shaft during normal operation. Thus, the rotational torque for the fine tuning shaft becomes too large to give the user a feeling of fine tuning. As another countermeasure for adjusting rotational torque it has also been proposed to use grease between the slip clutch and the channel selector shaft, but controlling the amount of grease used is very difficult, so that the slip clutch tends to become excessively and unfavorably slideable.

In consideration of the above disadvantages in the fine tuning device disclosed in U.S. patent application Ser. No. 97,847, I have found an improved fine tuning driving member wherein a metallic sheet member supported by a plastic collar member is added between the inner surface of the collar member and the outer surface of the metallic channel selector shaft to make a frictional connection by the metal—to—metal engagement.

OBJECTS OF THE INVENTION

In view of the above it is the aim of the invention to achieve the following objects singly or in combination:

to provide a new and improved memory fine tuning device of the rotary pre-setting type for television tuners, wherein the fine tuning operation is smoothly and positively assured;

to provide a television fine tuner using a fine tuning driving member provided with an improved slip clutch means together with a plate spring member for mounting an idler member for transmitting the fine tuning movement, on the front wall of the chassis, in such a simple manner that it can be assembled most stably by using additive metallic parts; and to provide a simplified rotary pre-setting fine tuning device for turret type television tuners, in which a fine tuning driving member comprises a fine tuning shaft, a slide driving gear, and a slip clutch mounted on a metallic channel selector shaft in front of the chassis, and wherein the slip clutch comprises a plastic collar member and a metallic sheet member retained by the collar member so as to make a slip clutch action between the metal—to—metal engagement.

SUMMARY OF THE INVENTION

In accordance with the present invention, a memory fine tuning mechanism of the rotary pre-setting type is provided which utilizes a fine tuning shaft, slide gear means and slip clutch means which provides a frictional force to the slide gear means. These parts are mounted concentrically around a metallic channel selector shaft to be rotatable, so that the initial rotation of the fine tuning shaft may carry the slide gear means to a predetermined position in the axial direction of the selector shaft, and by a continued rotation of the fine tuning shaft the slide gear means transmits rotary movement together with the slip clutch means for fine tuning operation, wherein the improvement is characterized by using a metallic sheet member for slip clutch means. The metallic sheet member is held by a plastic collar member, and mounted within a gap between the inside surface of the plastic collar member and the outside surface of a metallic channel selector shaft to rotate together with the collar member around the selector shaft to make a frictional connection between the metallic sheet member and the metallic channel selector shaft for obtaining rotational torque of the slip clutch means.

The present fine tuning device utilizes a metallic sheet member together with a resilient collar member, formed of plastics, to make a metal—to—metal engagement for a frictional connection. Such an arrangement is useful to produce smooth and stable friction for a fine tuning operation. Except for the slip clutch means, the parts of fine tuning driving mechanism, the spring and the idler members are the same as in copending U.S. patent application Ser. No.: 97,847 so as to use these parts in both tuner types.

BRIEF FIGURE DESCRIPTION

In order that the invention may be clearly understood, it will now be described, by way of example, with reference to the accompanying drawings, wherein.

DETAILED DESCRIPTION OF PREFERRED EXAMPLE EMBODIMENTS AND OF THE BEST MODE OF THE INVENTION

Figure 1:
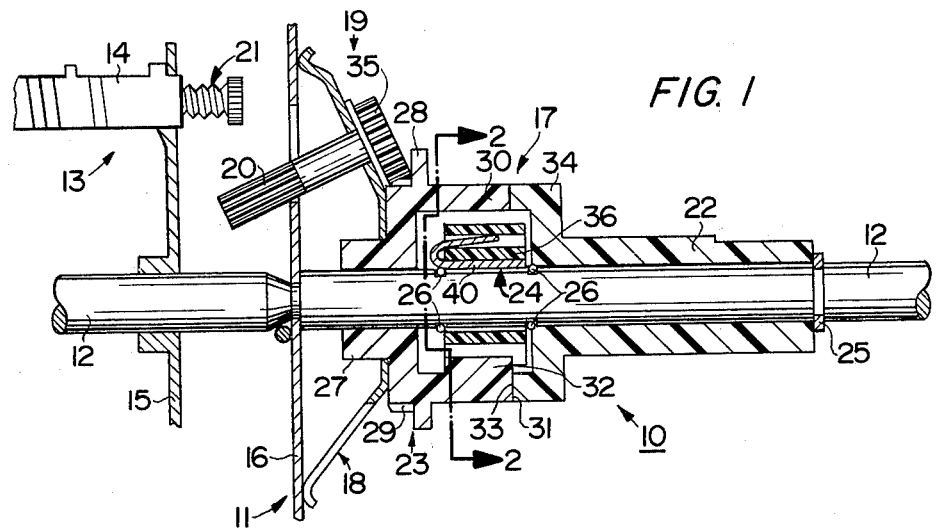
FIG. 1 is a side view of a tuner employing a fine tuning device in accordance with this invention.
Figure 2:
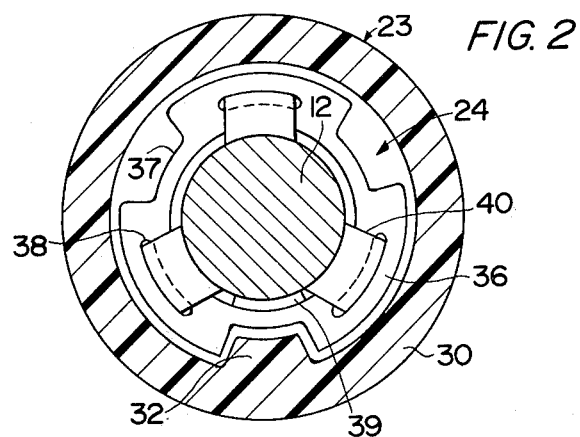
FIG. 2 is an enlarged sectional view along the line 2—2 in FIG. 1.
Figure 3:
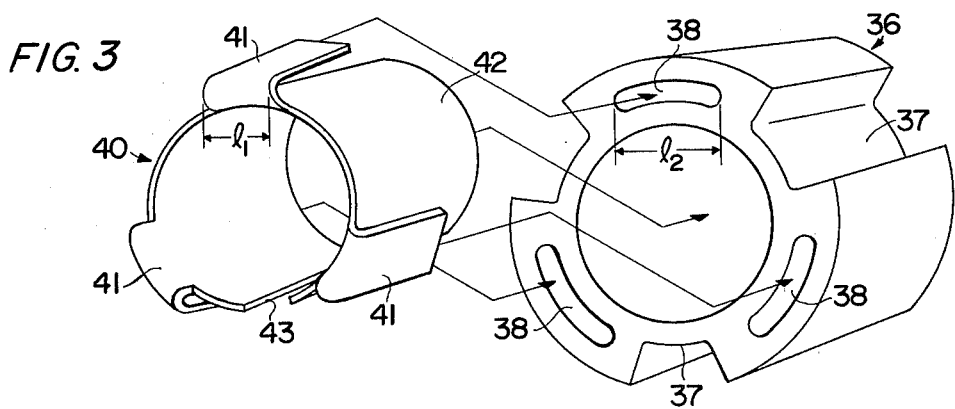
FIG. 3 is an exploded perspective view of the slip clutch means of the tuner of FIG. 1.

The drawings illustrate a memory fine tuning device of the rotary pre-setting type that is useful for a turret television tuner according to the present invention. FIGS. 1 to 3 show a fine tuning device 10, of the rotary pre-setting type, in a VHF turret type tuner including the chassis 11, a main channel selector shaft 12 and a shield cover (not shown). The chassis 11 has opposing walls, between which the channel selector shaft 12 carries a rotatable turret 13. The channel selector shaft 12 is journalled in both the front and rear walls of the chassis 11 with detent means to permit an indexing movement. A plurality of coil units 14 are mounted within the shielded chassis at the periphery of the supporting discs 15 fixed on the channel selector shaft 12 to form a drum shaped turret 13.

As shown in FIGS. 1 to 3, the fine tuning device 10 of the present invention is assembled on the front wall 16 of the chassis 11. FIG. 1 illustrates the released state of the fine tuning device which causes a fine tuning driving member 17 mounted concentrically around the selector shaft 12. A plate spring member 18 is held between the front wall 16 of the chassis 11 and the rear end portion of the fine tuning driving member 17. An idler member 19 for transmitting fine tuning movement is supported on the plate spring member 18, to be rotated freely. The fine tuning operation is achieved by engaging the gears of a pinion 20 with a fine tuning driven element or adjustment screw 21, which extends into an opening of a coil unit 14 adjacent to an oscillator coil, that may be moved back and forth by rotating the fine tuning driving member 17 when the latter is in the initial rotated condition. When no fine tuning operation is intended, the fine tuning adjustable screw 21 is not engaged to the pinion 20 of the idler member 19 as is shown in FIG. 1, whereby the channel selecting operation may be done by further rotating the selector shaft 12. The present fine tuning device for a turret type VHF tuner is pre-settable by rotation and is characterized in that the fine tuning driving member 17 comprises a fine tuning shaft 22, a slide gear 23, and a slip clutch 24 mounted around the channel selector shaft 12 by means of retainers 25 and 26.

The fine tuning shaft 25 and the slip clutch 24 are rotatably mounted at the given position of the selector shaft 12 between the retainers 25 and 26. The slide gear 23 is mounted to be movable in the axial direction of the selector shaft 12 within the spacing defined between the slip clutch 24 and the front wall 16 of the chassis 11. The resilient force of the plate spring 18 always biases the slide gear 23 outwardly. A smaller diametrical portion 27 extending in the axial direction, a flange portion 28 extending in the radial direction, and a peripheral gear 29 are provided at the rear portion of the slide gear 23. The gear 29 is able to engage the idler member 19 for transmitting the fine tuning movement. At the front portion of the slide gear 23, a greater diametrical portion 30 is provided, which forms a driven cam face 31 on the front end and has a raised portion 32 on the inner surface. The cam face 31 is connected to a driving cam face 33 formed at a greater diametrical portion 34 on the rear end side of the fine tuning shaft 22. The driving cam face 33 has the same diameter as the driven cam face 31 on the slide gear 23.

As shown in FIGS. 2 and 3, the slip clutch 24 comprises a plastic collar 36, which is a tube member provided with outer recesses 37 and peripheral flat holes 38, and a resilient metallic sheet 40 provided with tongues 41. The plastic collar 36 is made of lubricant plastic materials, such as molded plastics having a small amount of a lubricant agent added to them. The inner diameter of the collar 36 is larger than the outer diameter of the channel selector shaft 12 to form a gap 39 into which the metallic sheet 40 is inserted to make a frictional connection between the metallic sheet and the metallic shaft thereby providing a frictional force them. The metallic sheet 40 is made of a resilient bronze sheet by a stamping and bending process, to form a cylinder 42 having terminal edges 43 separated from each other in the circumferential direction to form a gap. The tongues 41 are formed by folding back three protrusions provided on said cylinder 42 to fit into the holes 38 located in projections between the outer recesses 37 in the plastic collar 36.

The idler member 19 is provided with a first gear 35 formed at the periphery of the head portion of the idler member 19 for engagement with the peripheral gear 29. The pinion 20 formed around the rod portion of the idler member 19 is engaged with a pinion formed at the top of the fine tuning adjustment screw 21. Preferably, the fine tuning driving member 17 and the idler member 19 are made as molded parts of plastic materials such as a resin material which is lightweight and relatively inexpensive.

Figure 4:
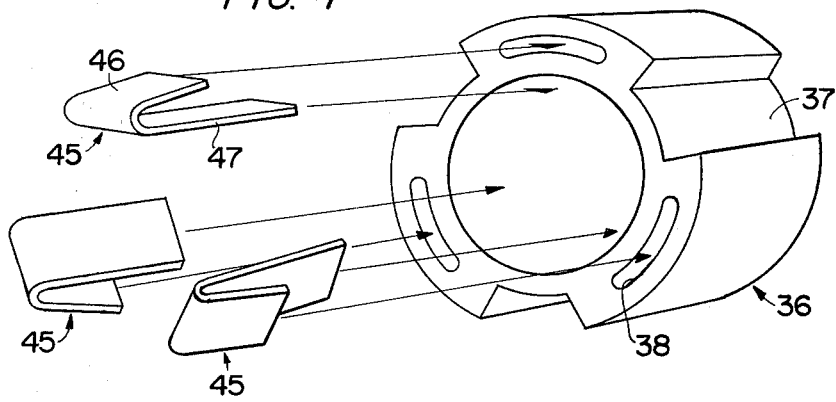
FIG. 4 is a perspective view of a modification of the slip clutch means of FIG. 3.

FIG. 4 illustrates a modification of slip clutch means used for the fine tuning device of the present invention, wherein a suitable and stable friction may be obtained by using separate parts of metallic sheets. In FIG. 4, a modified slip clutch used as the slip clutch 24 of FIG. 1 comprises the plastic collar 36, the same as in FIG. 3, and three U-shaped metallic strips 45 having short and long portions 46 and 47. These strips 45 are assembled to the collar 36 provided with three flat holes 38 by inserting short portions 46 therein. The frictional force may be adjusted by the thickness of the strips 45 made of metallic material.

Figure 5:
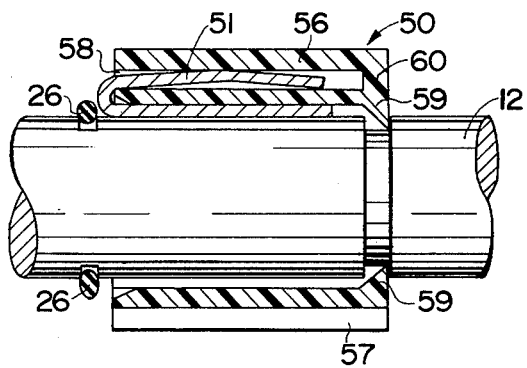
FIG. 5 is an enlarged side view of a partial portion of a fine tuning device of another embodiment.
Figure 6:
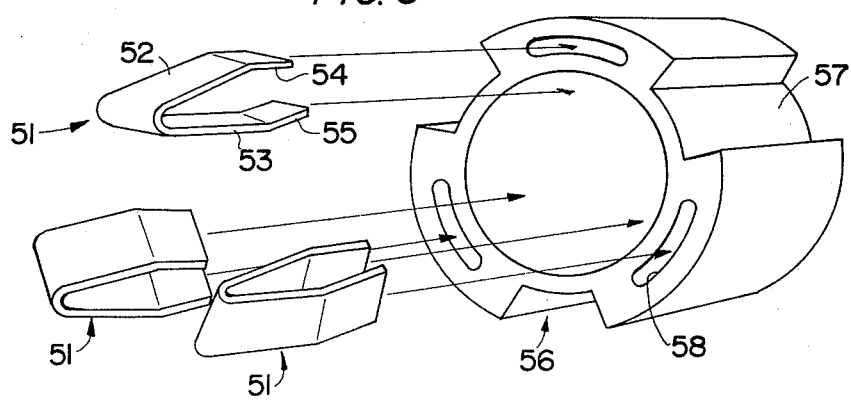
FIG. 6 is an exploded perspective view of the slip clutch means of FIG. 4

FIGS. 5 and 6 illustrate different slip clutch means used for the fine tuning device of the present invention, wherein a slip clutch 50 comprises a plastic collar 56 and three folded strips or leaf springs 51 assembled to each of the peripheral flat holes 58 formed through the thick portions between the outer recesses 58. The plastic collar 56 is provided with an inside rim portion 59 and a bottom wall 60 at one end of the plastic collar 56. At the other end the inner surface of the plastic collar 56 is partially tapered. The leaf spring 51 comprises symmetrical fold-back portions 52 and 53, each of which has fold-end portions 54 and 55. For using this simplified structure of the slip clutch 50, one of the retainers 26 is omitted by retaining the inside rim portion 59 in the slot of the selector shaft 12, and the assembly operation is easily achieved by means of symmetrical spring 51, bottom wall 60, and tapered inner surface of the collar 56. This type of slip clutch constitutes the best mode at this time, because of its simple and stable structure.

The plastic collar for the slip clutches is molded of polyacetal resins such as DELRIN (RTM) whereby fine particles of a lubricant, such as disulfide molybdenum, are added to the resin. The lubricant is added to the moldable plastic materials in the range of 5~20 percent (by weight). It is preferred to use polyfluoroethylene as a lubricant. The use of the lubricant serves to achieve a smooth movement of the slide gear 23. The use of a metallic sheet, strip or spring 40,45 or 51 inserted between the inner surface of the plastic collar 36 or 56 and the outer surface of the metallic channel selector shaft 12 is preferred to obtain a long-lasting, suitable, stable friction, because of the metal—to—metal engagement. Also, a suitable frictional force for a fine tuning operation may be selected by adjusting the thickness of the metallic sheet. Thus, the slip clutch means of this invention assures a stable frictional force.

In the above mentioned mechanical arrangement, the fine tuning operation is accomplished by continuous rotation of the fine tuning shaft 22. In the first stage of the rotation, the slide gear 23 is moved in the axial direction along the selector shaft 12 whereby the resilient biasing force of the plate spring member 18 is overcome until the slide gear 23 is stopped by contacting the front wall 16 of the chassis 11. As a result, each free end of the plate spring member 18 is compressed and slides along the wall surface of the chassis 11. The idler member 19, for transmitting the fine tuning movement, takes up a position almost parallel to the selector shaft 12 as opposed to the inclined position shown in FIG. 1.

That is, when the fine tuning shaft 22 is initially rotated, the slide gear 23 advances to the predetermined position, and when the fine tuning shaft 22 is continuously rotated, the raised portion 32 of the slide gear 23 engages with the outer recesses 37 of the collar 36 of the slip clutch 24 and is rotated together with the metallic sheet 40. Because the metallic sheet 40 of the slip clutch 24 is mounted around the selector shaft 12, a rotational torque of the fine tuning shaft 22 is fixed by a frictional force produced by the abutting engagement of the cylinder portion 42 of the metallic sheet 40 against the metallic selector shaft 12. Accordingly, the selection of the proper rotational torque is easily and accurately achieved by adjusting the thickness of the metallic sheet 40, so that a stable and accurate rotational torque is obtained. Additionally, as the plastic collar 36 is rotatably mounted on the selector shaft 12 by means of the metallic sheet 40, the defacement of the plastic collar 36 by frictional heat is prevented. Even if defacement is caused on the inner surface of the plastic collar 36, there is no effect on the rotational torque. On the other hand, although the metallic member 40 is heated by the friction produced by contact with the selector shaft 12, the metallic member is not affected by heat and also has good heat radiation characteristic. Accordingly, the fine tuning shaft 22 is provided with a stable rotational torque at all times by means of the slip clutch 24 and the slide gear 23.

The peripheral gear 29 of the slide gear 23 engages the first gear 35 of the idler member 19. The pinion of the screw 21 simultaneously engages the second pinion 20 so as to provide an operative engagement or coupling of the gears in the mechanism. In the next stage of rotation, that is, when the rotation of the fine tuning shaft 22 is continued, the slide gear 23 is rotated with the frictional resistance of the slip clutch 24 connecting cam faces, since the axial movement is stopped when the rear end of the slide gear 23 contacts the front wall of the chassis 11. Therefore, the fine tuning adjustment screw 21 is able to move back and forth within the coil unit 14 for achieving the desired fine tuning.

In another embodiment shown in FIGS. 5 and 6, one of the retainers 26 may be replaced by the integral rim portion 59 of the plastic collar 56 in the slip clutch 50. A reduction of the number of the necessary parts makes the assembly easier, reduces the manufacturing costs substantially, and increases the practical industrial value of such tuners. However, the use of metallic strips 45 or leaf springs 51 as illustrated in FIGS. 4 and 6 is better than the use of the cylindrical metallic sheet 40 as slip clutch means as shown in FIG. 3. At this time, the substituted portions of the cylindrical portion 42 of the metallic sheet 40 function to cause the resilient abutting against the selector shaft 12.

Although the invention has been described with reference to specific example embodiments, it is to be understood that it is intended to cover all modifications and equivalents within the scope of the appended claims.

What is claimed is:

1. A television tuner of the turret type comprising a selector shaft carrying a rotatable turret in a chassis, said turret including a plurality of tuning coil units corresponding to different television channels, each tuning coil unit having an adjustment element, and memory fine tuning means for adjusting any one of said adjustment elements when said rotatable turret is in a predetermined position, said fine tuning means comprising, fine tuning driving means mounted concentrically around said selector shaft, said fine tuning driving means including a fine tuning shaft, slide gear means and cam surface means for rotatably connecting said slide gear means to said fine tuning shaft, slip clutch means rotatably connected to said slide gear means, said slip clutch means including a plastic collar member loosely mounted around said selector shaft and a metallic sheet member inserted in a gap formed between said collar member and said selector shaft; spring means located on said chassis for normally biasing said slide gear means in a direction away from said chassis; and idler means supported in said spring means for transmitting rotary movement from said fine tuning driving means to said adjustment element and for responding to a continuous rotation of said fine tuning shaft which rotates said slide gear means whereby a rotary pre-setting memory fine tuning is provided.

2. The tuner of claim 1, wherein said plastic collar member of said slip clutch means comprises a tube member provided with outer recesses for receiving a raised portion of said slide gear means, and flat holes for receiving a portion of said metallic sheet member.

3. The tuner of claim 2, wherein said metallic sheet member is provided with a cylinder located in the gap between said plastic collar member and said selector shaft and tongues inserted into said flat holes of said plastic collar member.

4. The tuner of claim 2, wherein said metallic sheet member comprises a plurality of metallic strips or leaf springs provided with folded portions, one of said portions is located between said plastic collar member and said selector shaft, and the other of said portions is inserted into said flat holes of said plastic collar member.

5. The tuner of claim 4, wherein each of said metallic strips or leaf springs is provided with symmetrical foldback portions.

6. The tuner of claim 2, wherein said plastic collar member is further provided with a rim portion and bottom wall at one end of said plastic collar member, said rim portion serving as a retainer on said selector shaft, and said bottom wall serving as a guide for the proper inserting direction.

7. A fine tuning device for a turret type television tuner, comprising chassis means, channel selector shaft means supported in said chassis means, fine tuning driving means mounted concentrically around said channel selector shaft means, said fine tuning driving means comprising a fine tuning shaft, a slide gear member and cam means for rotatably connecting said fine tuning shaft to said slide gear member, and slip clutch means frictionally mounted on said slide gear member, said slide gear member having a radially extending flange and a peripheral gear on said flange, a plate spring member located on the front wall of said chassis means for biasing said fine tuning driving means in a forward direction opposite to the sliding direction of said slide gear member, idler means supported in said plate spring member for transmitting the rotation of said slide gear member to a fine tuning adjustment screw means movable within respective coil means, wherein said slip clutch means comprises a plastic collar member provided with outer recessed portions and flat holes formed in the axial direction, and a metallic sheet member inserted between the inner surface of said plastic collar member and the outer surface of said selector shaft means so as to connect frictionally said selector shaft means and said slip clutch means by a metal—to—metal engagement.

* * * * *